United States Patent [19]

Houghton et al.

[11] Patent Number: 5,532,969

[45] Date of Patent: Jul. 2, 1996

[54] CLOCKING CIRCUIT WITH INCREASING DELAY AS SUPPLY VOLTAGE VDD

[75] Inventors: Russell J. Houghton, Essex Junction, Vt.; Duane E. Galbi, Marlborough, Mass.

[73] Assignee: International Business Machines Corporation, Armonk, N.Y.

[21] Appl. No.: 319,898

[22] Filed: Oct. 7, 1994

[51] Int. Cl.[6] .................................................. G11C 13/00
[52] U.S. Cl. .......................... 365/226; 365/149; 365/194; 365/233; 327/277; 327/284
[58] Field of Search ................................. 365/226, 194, 365/233, 149, 102, 206; 327/276, 277, 278, 283, 284, 285, 288

[56] References Cited

U.S. PATENT DOCUMENTS

| | | | |
|---|---|---|---|
| 4,366,558 | 12/1982 | Homma et al. | 365/189 |
| 4,656,612 | 4/1987 | Allan | 365/203 |
| 4,727,517 | 2/1988 | Ueno et al. | 365/203 |
| 4,813,021 | 3/1989 | Kai et al. | 365/194 |
| 4,829,479 | 5/1989 | Mitsumoto et al. | 365/189.09 |
| 4,841,488 | 6/1989 | Sanada | 365/233 |
| 4,954,992 | 9/1990 | Kumanoya et al. | 365/207 |
| 5,062,082 | 10/1991 | Choi | 365/194 X |
| 5,398,207 | 3/1995 | Tsuchida et al. | 365/149 X |
| 5,424,985 | 6/1995 | McClure et al. | 365/233 X |

FOREIGN PATENT DOCUMENTS 2-154393  7/1990  Japan.

OTHER PUBLICATIONS

Watanabe et al., "A New CR–Delay Circuit Technology for High–Density and High–Speed DRAM's," IEEE Journ. of Solid–State Circuits, vol. 24, No. 4, pp. 905–910, Aug. 1989.

Primary Examiner—Do Hyun Yoo
Attorney, Agent, or Firm—Heslin & Rothenberg

[57] ABSTRACT

A clocking circuit and clocking method provide a clocking signal that tracks supply voltage VDD such that as supply voltage VDD increases, the signal generation delay also increases. Complementary circuit embodiments and methods are described. In one clocking circuit, a capacitive load stores an amount of charge that varies with supply voltage VDD. A discharge circuit linearly discharges the capacitive load under control of a switch which is responsive to an input signal. A detection circuit is coupled to the capacitive load for detecting linear discharging of the capacitive load to a trigger level $V_0$ and for providing the clocking signal upon detection of the trigger level. The trigger level is predefined and substantially independent of variation in supply voltage VDD. The clocking techniques presented can be advantageously employed within memory devices such as DRAMs or SRAMs.

45 Claims, 3 Drawing Sheets fig. 1 fig. 2 fig. 3 fig. 4 fig. 5 fig. 6

CLOCKING CIRCUIT WITH INCREASING DELAY AS SUPPLY VOLTAGE VDD

TECHNICAL FIELD

The present invention relates in general to clocking circuitry, and more particularly, to a novel clocking circuit and method having a signal generation delay that increases with increasing supply voltage VDD. The circuit and method are particularly relevant to semiconductor memory devices such as dynamic random-access memories and static random-access memories.

BACKGROUND ART

One critical self-timed delay in memory devices such as dynamic random-access memory (DRAM) devices is the delay between activation of word lines and setting of the corresponding sense amplifiers. As discussed in detail herein, an ideal set delay for a constant voltage word system would be a delay which increases slightly with supply voltage VDD to the memory device. Briefly explained, this is because in a complementary metal-oxide semiconductor (CMOS) array with a constant word line voltage architecture the word line high level $V_{WL}$ is set independent of supply voltage VDD, whereas the conventional bit line precharge voltage of VDD/2 obviously varies with supply voltage VDD. Thus, the minimal word line voltage, and hence the word line rise time, necessary to transfer a "1" level to a bit line increases with supply voltage VDD. The delay between word line activation and sense amplifier setting would therefore also preferably increase with increasing supply voltage VDD.

Previously, conventional gate delay chains have been employed to generate on-chip clocking delays. Unfortunately, the "trip point" of such a chain increases linearly with supply voltage VDD, while the current drive of the previous stage increases with the square of supply voltage VDD. Hence, the delay length generated by the delay chain decreases as supply voltage VDD increases. Furthermore, inverter-based clocking signals typically vary as a function of process and temperature. Therefore, in order to guarantee sufficient delay at high voltage conditions, and other operating extremes, extra delay must be added to the inverter chain. This extra delay necessarily degrades performance of the semiconductor memory device.

An alternative clocking approach is presented by Watanabe et al. in an article entitled "A New CR-Delay Circuit Technology For High Density and High Speed DRAMs", IEEE Journal of Solid-State Circuits, Vol. 24, No. 4, pp. 905–910, August 1989. In this technique, a resistance-capacitance (RC) time constant is employed by measuring the time taken to discharge a capacitor to a certain percentage of supply voltage VDD. The RC time constant is independent of supply voltage VDD, depending only on the absolute value of the resistor and the capacitor in the network. Although good process control over the capacitance and resistance elements is claimed, in practice there is a twenty (20%) percent variation in the gate capacitance and a 2× variation in the n-well capacitance (i.e., the resistive element). Thus, the RC of this circuit necessarily has a large process dependence. Furthermore, in a constant boost voltage architecture, a supply voltage VDD independent clocking delay is not ideal.

DISCLOSURE OF INVENTION

Briefly summarized, in a first aspect the present invention comprises a clocking circuit for generating an output signal in response to an input signal. The clocking circuit is powered by a supply voltage VDD and includes a capacitive load for storing an amount of charge that varies with supply voltage VDD. A discharge means is provided for linearly discharging the capacitive load and a switch means is coupled between the capacitive load and the discharge means for controlling linear discharging of the load. The switch means is responsive to the input signal. A detection means is coupled to the capacitive load for detecting linear discharging of the capacitive load to a trigger level $V_0$, and for providing the output signal upon detection of the trigger level $V_0$ at the capacitive load. The trigger level $V_0$ is predefined and substantially independent of variation in supply voltage VDD. As a specific example, the discharge means can comprise a constant current source, the switch means can be a first inverter, and the detection means a second inverter. Preferably, the trigger voltage $V_0$ is near ground potential; for example, one transistor threshold voltage $V_T$ above ground potential. As an application, the clocking circuit can be advantageously employed within a memory device for sense amplifier setting subsequent to word line activation.

In another aspect, a complementary clocking circuit is set forth, again for generating an output signal in response to an input signal. This complementary clocking circuit is powered by a supply voltage VDD and includes a capacitive load for storing an amount of charge. A charge means is provided for linearly charging the capacitive load from a ground potential. Switch means is coupled between the capacitive load and the charge means for controlling linear charging of the capacitive load by the charge means. The switch means is responsive to the input signal. A detection means is coupled to the capacitive load for detecting linear charging of the capacitive load to a trigger level $V_0$ and for providing the output signal upon detection of the trigger level. The trigger level is predefined to track any variation in supply voltage VDD. Preferably, the trigger level $V_0$ is close to supply voltage VDD, being for example, one transistor threshold voltage $V_T$ below supply voltage VDD. Again, as an example of one application, the clocking circuit can be advantageously employed within a memory device to control setting of the sense amplifiers.

In still another aspect, the invention comprises a clocking method for generating an output signal in response to an input signal. The method includes the steps of: storing a first amount of charge in a capacitive load, the first amount of charge stored varying with supply voltage VDD; responsive to the input signal, linearly discharging the capacitive load; simultaneous with discharging the load, detecting when a trigger level $V_0$ exists at the capacitive load, the trigger level being predefined and independent of supply voltage VDD; and outputting the output signal upon detecting the trigger level $V_0$. As a further aspect, an alternative clocking method for the complementary clocking circuit outlined above is also presented.

To restate, certain novel clocking circuits and clocking methods are presented wherein signal generation tracks variations in supply voltage VDD. Because there is a tracking of supply voltage VDD, the extra delay typically added in a conventional inverter chain can be omitted, thereby enhancing performance of the device employing the novel clocking circuit/method. For example, the clocking circuit/method are particularly useful in semiconductor memory devices such as dynamic random access memories and static random access memories, wherein read-out characteristics of the memory cells can be tracked.

BRIEF DESCRIPTION OF DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Reference is now made to the drawings in which use of the same reference numbers/characters throughout different figures designates the same or similar components. The embodiments discussed herein include complementary metal-oxide semiconductor (CMOS) circuits with p-channel field-effect transistors (PFETs) indicated in the drawings by a rectangle with a diagonal line formed therein and a control element or gate electrode arranged adjacent thereto, and with n-channel field-effect transistors (NFETs) indicated by a rectangle without a diagonal line formed therein but with a control element or gate electrode arranged adjacent thereto.

Figures 1, 2:
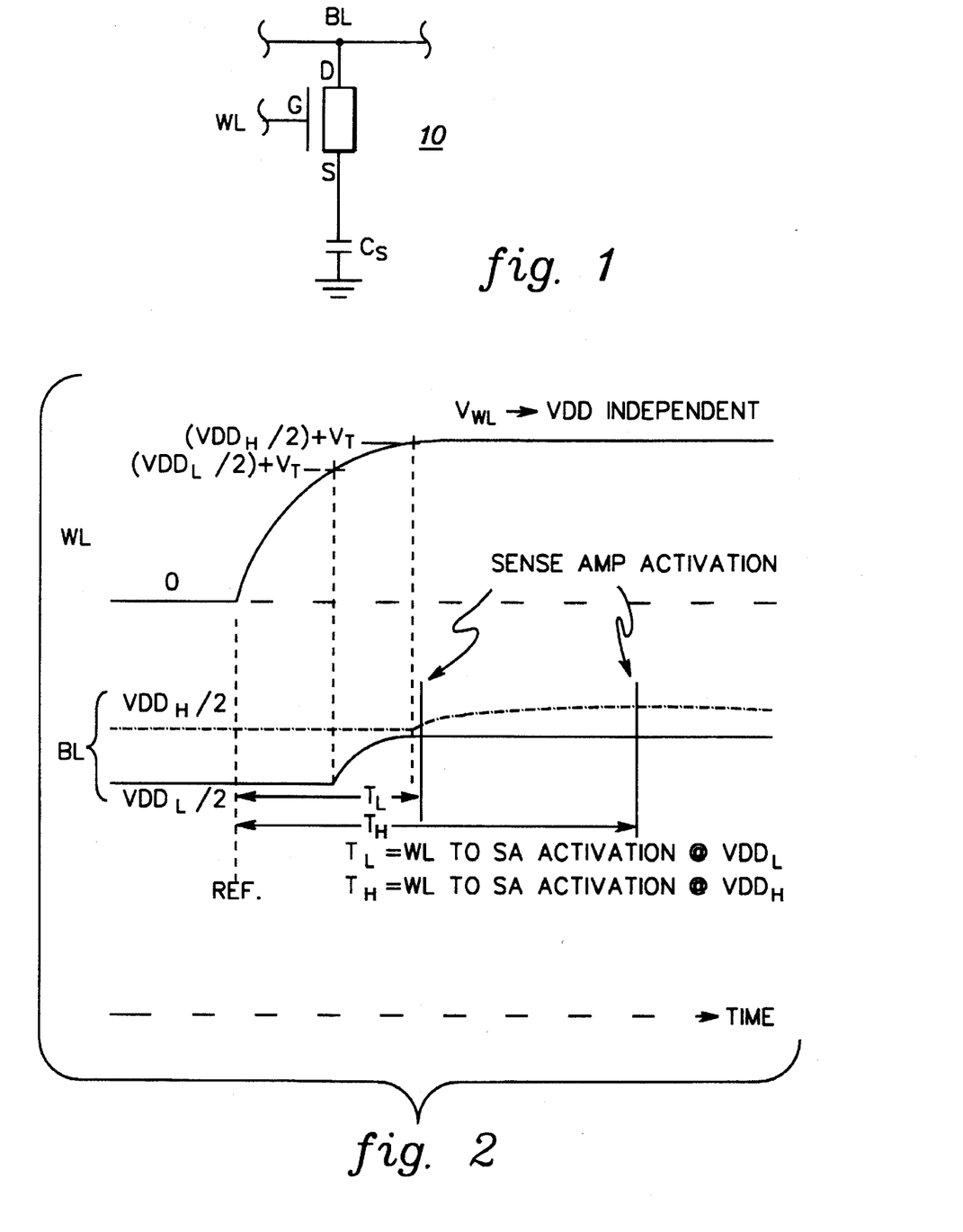
FIG. 1 is a schematic of one embodiment of a memory cell.
FIG. 2 is a timing diagram for the memory cell of FIG. 1 showing word line and bit line signal development.

One embodiment of a typical memory cell, generally denoted 10, is depicted in FIG. 1. Cell 10 includes an n-channel field-effect transistor (NFET) and a storage capacitor $C_S$. The memory cell is gated 'G' by the signal on a corresponding word line 'WL', which is typically regulated to a constant voltage $V_{WL}$ i.e., to a voltage that is supply voltage VDD independent (see FIG. 2). The source 'S' of the NFET is connected to the storage capacitor $C_S$, while the drain 'D' is connected to the corresponding bit line 'BL'.

In a conventional memory device having a grid of word lines and bit lines, such as in a dynamic random-access memory (DRAM) device, two bit lines 'BL' are coupled to a sense amplifier. The sense amplifier detects the logic state stored in a memory cell coupled to one of the bit lines. Each bit line is precharged to a voltage $VDD/2$. To read a memory cell, the gate 'G' of the cell is driven by the associated word line to an "on" state, i.e., to a voltage level $VDD/2$ plus $V_T$ (where $V_T$ is the threshold voltage of the field-effect transistor (FET)). When a memory cell is so selected, the corresponding bit line will either lose charge, because the storage capacitor $C_S$ of the selected cell holds a '0', or will rise, because the storage capacitor C, contains a '1'. In either case, the reference bit line will be unchanged. The corresponding sense amplifier(s) activates shortly after activation of the word line(s) to amplify any voltage difference between the bit lines. As shown in FIG. 2, however, the clocking delay needed before initiating sense amplifier activation is VDD dependent.

Specifically, in the case of a low supply voltage $VDD_L$, a shorter delay interval $T_L$ is needed prior to sense amplifier activation compared with the required delay interval $T_H$ of a high supply voltage $VDD_H$ case. Thus, to optimize performance, a clocking circuit (and method) is needed that produces a delayed clock signal which tracks supply voltage VDD such that as supply voltage VDD increases, the delay prior to turn-on of the sense amplifiers also increases.

The delay time (e.g., $T_L$, $T_H$) prior to valid sense amplifier activation is composed of two components. First, there is an interval from the time the associated word line becomes active until the memory cell begins to conduct. This interval is a function of supply voltage VDD since, as noted, a voltage level $VDD/2$ plus $V_T$ is needed prior to turn-on of the memory cell. Once the cell is activated, there is a second delay before valid data is established on the associated bit line. This second delay varies with the amount of "overdrive" provided on the word line after activation of the memory cell. As shown in FIG. 2, the overdrive for the high supply voltage $VDD_H$ case, i.e., the voltage difference between word line voltage $V_{WL}$ and cell activation voltage $(VDD_H/2)+V_T$ is substantially less than that for the low supply voltage $VDD_L$ case, i.e., the voltage difference between $V_{WL}$ and $((VDD_L/2)+V_T)$. The first of these two delay components is more critical in terms of sense amplifier setting.

In view of the above, even though external supply voltage VDD is rising and all circuits in a memory device may be operating faster, the opposite effect is actually desired for the clocking signal fed to the sense amplifiers. This is the issue addressed by the clocking circuit and clocking method of the present invention.

Figure 3:
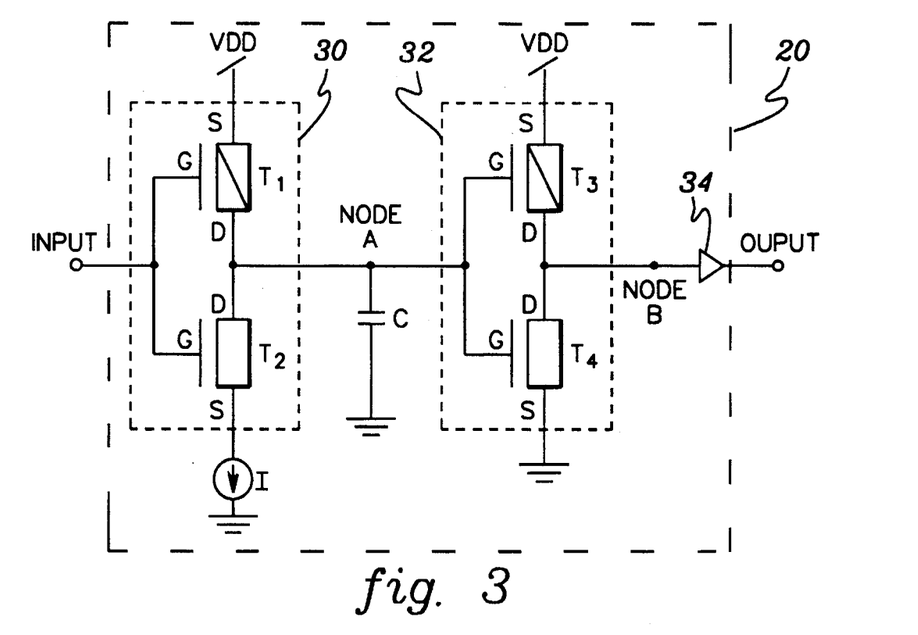
FIG. 3 is a schematic of one embodiment of a clocking circuit in accordance with the present invention.
Figure 5:
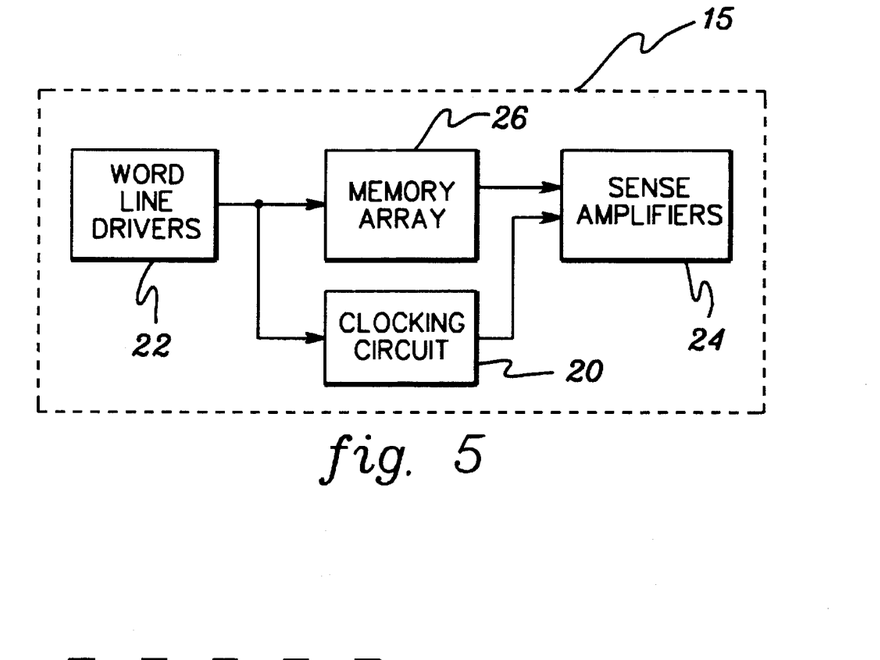
FIG. 5 is a block diagram of one embodiment of a semiconductor memory device employing the clocking circuit of FIG. 3.

FIG. 3 depicts one embodiment of a clocking circuit, generally denoted 20, in accordance with this invention. In one application, clocking circuit 20 is employed within a semiconductor memory device, such as device 15 depicted in FIG. 5. As shown therein, clocking circuit 20 receives as input a signal from word line drivers 22 and provides an output set signal to sense amplifiers 24. The output signal from clock circuit 20 to amplifiers 24 functions to clock reading of corresponding bit lines in memory array 26.

Returning to the schematic of FIG. 3, and assuming that clocking circuit 20 is employed within a semiconductor memory device, then "input" to the circuit might be from a reference word line driver. This "input signal" gates an inverter 30, which functions as a switch that controls charging or discharging of a capacitive load 'C' connected between node A and ground potential. In operation, inverter 30 controls charging of capacitive load 'C' by connecting node A to supply voltage VDD and discharging of the capacitive load by connecting node A to a constant current source 'I' coupled between inverter 30 and ground potential GND. Constant current source 'I' provides a current that is independent of the supply voltage VDD provided to the clocking circuit and memory device.

Inverter 30 includes a PFET $T_1$ and an NFET $T_2$, which as shown have commonly connected drains 'D' and commonly connected gates 'G'. The gates 'G' are wired to receive the input signal. Operationally, when the input signal is low, PFET $T_1$ is "on" such that node A is connected to supply voltage VDD and capacitive load 'C' charges up to supply voltage VDD. When the input signal rises, PFET $T_1$ turns "off" and NFET $T_2$ turns "on" thereby discharging capacitive load 'C' through the constant current source 'I'. Implementation of current source 'I' is discussed in detail below.

The signal at node A feeds a second inverter 32 coupled between supply voltage VDD and ground potential GND. Inverter 32 includes a PFET $T_3$ and an NFET $T_4$ having commonly connected drains 'D' and commonly controlled gates 'G'. In accordance with this embodiment of the invention, the ratio of sizes of NFET $T_4$ to PFET $T_3$ is preferably selected such that the trigger voltage level $V_0$ at which an output set signal is provided (see FIG. 4) is close to ground potential GND. Selection of such a point ensures greatest clocking delay capabilities from circuit 20. In particular, if current source 'I' and capacitance 'C' values are maintained constant, then a greater delay is achieved by requiring a longer voltage transition from a stored voltage $VDD_H$ or $VDD_L$ to the trigger level $V_0$. By way of example, the size ratio of NFET:PFET might be at least 3:1, with trigger level $V_0$ being largely defined by the size of NFET $T_4$. Because trigger level $V_0$ is determined by the size ratio of NFET $T_4$ and PFET $T_3$ the level is independent of supply voltage VDD. This is a significant feature of the clocking circuit. If desired, an inverter 34 can be employed to improve rise and fall time at the output. In this regard, see FIG. 4 and compare signals at node B with those at the output of the clocking circuit.

Since trigger level $V_0$ will always have some tolerance, it is desirable to make the trigger level $V_0$ as small as possible compared with the range of voltage change of the clocking circuit, i.e., the voltage difference between supply voltage VDD and trigger level $V_0$. By making the difference between level $V_0$ and the range of voltage change of the clocking circuit as large as possible, the effect of circuit tolerances at trigger level $V_0$ can be minimized. As a specific example, trigger level $V_O$ might comprise one threshold voltage drop $V_T$ above ground potential GND.

Figure 4:
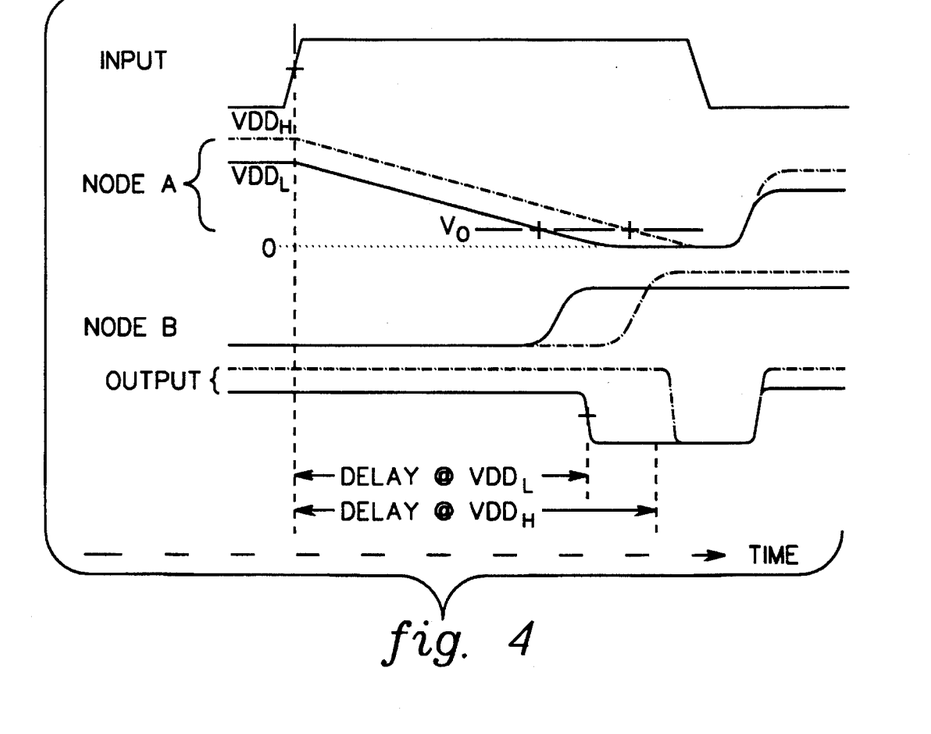
FIG. 4 is a timing diagram showing signal development through the clocking circuit of FIG. 3 for two different levels of supply voltage VDD, namely a high supply voltage $VDD_H$ and a low supply voltage $VDD_L$.

As shown in FIG. 4, a clocking circuit in accordance with this invention provides a variable delay from memory cell activation until sense amplifier setting to ensure the presence of valid data on the corresponding bit line. This delay is shown to increase with an increase in supply voltage VDD. Also note from this figure that there is a linear discharge of stored capacitance at node A from the supply voltage ($VDD_H$ or $VDD_L$) level to ground potential '0'.

As briefly noted above, current source 'I' is designed to be independent of supply voltage VDD. This can be achieved by employing a pair of metaloxide semiconductor transistors that have similar characteristics but different threshold voltages. The higher threshold device would be diode connected (with gate and drain shorted) and wired between the gate and source of the lower threshold device. This diode connected device is biased by a current to operate near its threshold and provide a drive voltage to the lower threshold device that is substantially independent of supply voltage VDD. In this way, the drain current from the second, lower threshold device comprises a substantially constant current source 'I' that is independent of supply voltage VDD.

Further, minimum current drain is an important consideration in any memory device design. Therefore, current source 'I' will typically be turned on only when needed to generate a clocking signal. Thus, the current source must be activated whenever the memory device is selected and must accurately reach its desired constant current level before a clocking signal is required. This can be facilitated by "pulsing" the bias current to the higher threshold diode connected device to a much higher level than the bias current required. By so pulsing the current, a quick charging of the circuit capacitances is achieved. The current will overshoot its desired value but then decay to the desired value in a much shorter time compared with simply turning the bias current on without any pulse overshoot. Quick turn-off of the current source can be achieved by feeding back the output signal to the bias circuit to turn-off the bias current to the diode connected device, and consequently the current source 'I'. Such a feedback technique minimizes time that the current source is on and, therefore, overall power requirements of the device.

Use of current source 'I' also has an important tracking advantage relative to the word line drivers. Assuming that the word line of the memory device is driven high with a higher threshold device like the one used in diode configuration to bias the delay current source, then tracking works as follows. If the higher threshold device is weak, word line rise time will be longer and the current source 'I' will produce a lower constant current. A slower word line results in the need for a longer delay before sense amplifier activation. The lower value of current results in a corresponding longer delay within the clocking circuit to track the sense amplifier activation time requirement.

Figure 6:
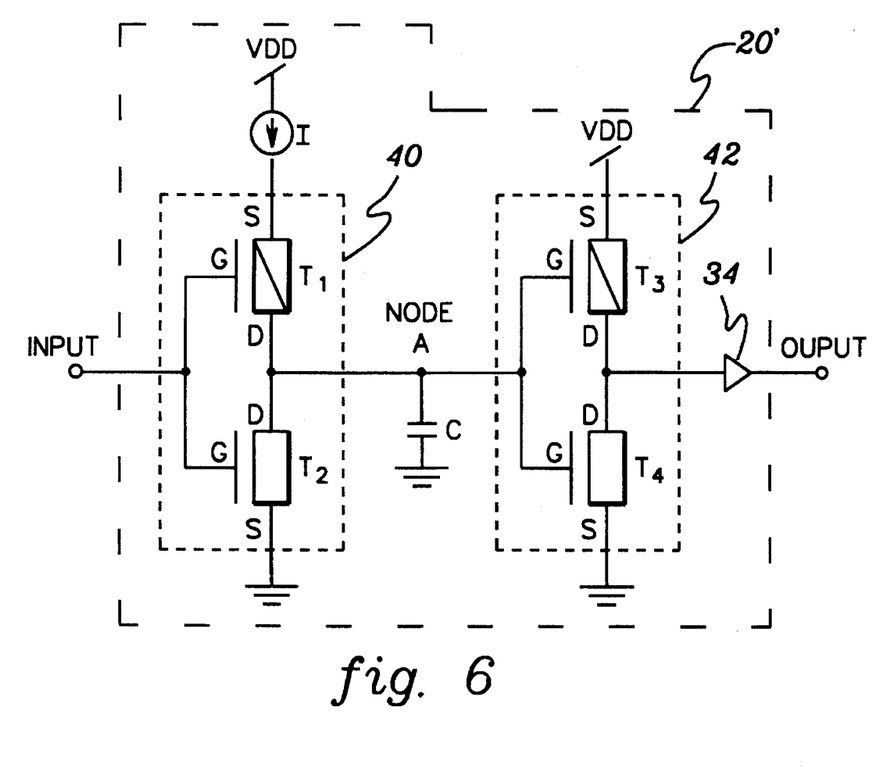
FIG. 6 is a schematic of an alternate embodiment of a clocking circuit in accordance with the present invention.

An alternate clocking circuit embodiment, denoted 20', is shown in FIG. 6 This circuit comprises a complementary version of the circuit of FIG. 3, wherein the polarities of essentially all signals are reversed. In this embodiment, the word line drives an inverter 40 which again comprises a PFET $T_1$ and NFET $T_2$ having common drain and common gate connections. Inverter 40 is coupled between a constant current source 'I' and ground potential GND. Current source 'I' is powered by supply voltage VDD. In operation, inverter 40 switches constant current source 'I' to charge node A whenever the input signal is low, and discharges the capacitive load via NFET $T_2$ when the input signal goes high. The signal at node A drives a second inverter 42 connected as described above in connection with inverter 32 of FIG. 3, with the exception that the PFET to NFET sizing ratios are reversed. Again, further buffering 34 can be employed if desired.

The sizing ratios of the PFET to NFET (e.g., 10:1) are such that the trigger level $V_0$ will be near supply voltage VDD, for example, one threshold voltage $V_T$ below the supply voltage VDD. By so sizing the transistors, trigger level $V_0$ will track the supply voltage VDD. Thus, as supply voltage VDD increases, the delay interval required to charge the capacitive load from ground potential to the trigger level $V_0$ will increase correspondingly.

To restate, certain novel clocking circuits and clocking methods have been described herein wherein signal generation tracks variations in supply voltage VDD. Because there is a tracking of supply voltage VDD, the extra delay typically added in a conventional inverter chain can be omitted, thereby enhancing performance of the device employing the novel clocking circuit/method. For example, the clocking circuit/method are particularly useful in semiconductor memory devices such as dynamic random access memories and static random access memories, wherein read-out characteristics of the memory cells can be tracked.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A clocking circuit for generating an output signal in response to an input signal, said clocking circuit being powered by a supply voltage VDD and having a delay in generating said output signal relative to the input signal that varies with variation in said supply voltage VDD such that as said supply voltage increases, the delay in generating said output signal increases therewith, said clocking circuit comprising:

a capacitive load for storing an amount of charge, said amount of charge stored by said capacitive load varying with said supply voltage VDD;

discharge means for linearly discharging said amount of charge stored by said capacitive load;

switch means coupled between said capacitive load and said discharge means for controlling linear discharging of said amount of charge stored by said capacitive load by said discharge means, said switch means being responsive to said input signal; and detection means coupled to said capacitive load for detecting linear discharging of the capacitive load to a trigger level $V_0$ and for providing said output signal upon detection of said trigger level $V_0$ at said capacitive load, said trigger level $V_0$ being predefined and substantially fixed relative to ground potential GND and independent of variation in said supply voltage VDD, wherein said amount of charge stored at said capacitive load varying with said supply voltage VDD, said linear discharging of said amount of charge stored by said capacitive load and said detection means detecting linear discharging of the capacitive load to the trigger level $V_0$ that is independent of supply voltage VDD results in the delay in providing said output signal relative to said input signal that varies with variation in said supply voltage VDD such that as said supply voltage increases, the delay in providing said output signal increases therewith.

2. The clocking circuit of claim 1, further comprising charge means for charging said capacitive load to said supply voltage VDD, and wherein said switch means is coupled between said capacitive load and said charge means.

3. The clocking circuit of claim 2, wherein said charge means comprises said supply voltage VDD.

4. The clocking circuit of claim 1, wherein said discharge means comprises a current source, said current source producing a constant current that is substantially independent of variation in said supply voltage VDD.

5. The clocking circuit of claim 1, wherein said trigger level $V_0$ is proximate to the ground potential GND on a scale from the ground potential GND to the supply voltage VDD.

6. The clocking circuit of claim 5, wherein said trigger level $V_0$ is approximately one transistor threshold voltage $V_T$ above the ground potential GND.

7. The clocking circuit of claim 1, wherein said detection means comprises a first inverter, said first inverter being coupled between said supply voltage VDD and the ground potential GND, and being coupled to the capacitive load for monitoring the amount of stored charge at said capacitive load.

8. The clocking circuit of claim 7, wherein said first inverter comprises an n-type field-effect transistor (NFET) and a p-type field-effect transistor (PFET), said NFET and said PFET being commonly gated by said capacitive load and having commonly coupled drains.

9. The clocking circuit of claim 8, wherein said NFET is larger than said PFET and said NFET and said PFET have a size ratio NFET:PFET of at least 3:1, and wherein said trigger level $V_0$ is determined principally by said size ratio NFET:PFET.

10. The clocking circuit of claim 7, wherein said switch means comprises a second inverter, said second inverter being coupled between said supply voltage VDD and said discharge means and having an output connected to said capacitive load.

11. The clocking circuit of claim 1, wherein said clocking circuit is employed within a memory device powered by said supply voltage VDD, said memory device having multiple word lines and multiple sense amplifiers, said clocking circuit being coupled between said multiple word lines and said multiple sense amplifiers, said clocking circuit producing said output signal for delayed sense amplifier setting subsequent to word line activation.

12. The clocking circuit of claim 11, wherein said memory device comprises a dynamic random access memory device.

13. A clocking circuit for a memory device powered by a supply voltage VDD, said memory device having at least one sense amplifier, said clocking circuit producing in response to an input signal a set signal for sense amplifier setting, said clocking circuit having a delay in generating said output signal relative to the input signal that varies with variation in said supply voltage VDD such that as said supply voltage increases, the delay in generating said output signal increases therewith, said clocking circuit comprising:

a current source for producing a constant current independent of variation in said supply voltage VDD;

a capacitive load for storing an amount of charge, said amount of charge stored by said capacitive load varying with said supply voltage VDD;

switch means coupled between said capacitive load and said current source for controlling linear discharging of said amount of charge stored by said capacitive load through said current source, said switch means being responsive to said input signal; and detection means coupled to said capacitive load for detecting linear discharging of the capacitive load to a trigger level $V_0$ and for providing said set signal upon detection of said trigger level $V_0$ at said capacitive load, said trigger level $V_0$ being predefined and substantially fixed relative to ground potential GND and independent of variation in said supply voltage VDD, wherein said amount of charge stored at said capacitive load varying with said supply voltage VDD, said linear discharging of the amount of charge stored by the capacitive load through the current source, and said detection means detecting linear discharging of the capacitive load to the trigger voltage $V_0$ results in the delay in generating said output signal relative to said input signal that varies with variation in said supply voltage VDD such that as said supply voltage increases, the delay in providing said output signal increases therewith.

14. The clocking circuit of claim 13, wherein said trigger level $V_0$ is proximate to the ground potential GND on a scale from the ground potential GND to the supply voltage VDD.

15. The clocking circuit of claim 14, wherein said trigger level $V_0$ is approximately a transistor threshold voltage $V_T$ above the ground potential GND.

16. The clocking circuit of claim 13, wherein said detection means comprises a first inverter, said first inverter being coupled between said supply voltage VDD and the ground potential, and being connected to receive as input charge stored at said capacitive load.

17. The clocking circuit of claim 16, wherein said first inverter includes an n-type field-effect transistor (NFET) and a p-type field-effect transistor (PFET), said NFET and said PFET being commonly gated by said capacitive load and having commonly coupled drains.

18. The clocking circuit of claim 17, wherein said NFET is larger than said PFET, and said NFET and said PFET have a size ratio NFET:PFET of at least 3:1.

19. The clocking circuit of claim 13, wherein said memory device comprises a dynamic random access memory device and wherein said clocking circuit is connected to receive as input an activation signal from a word line driver in the dynamic random access memory device.

20. A clocking circuit for generating an output signal in response to an input signal, said clocking circuit being powered by a supply voltage VDD, and having a delay in generating said output signal relative to the input signal that varies with variation in said supply voltage VDD such that as said supply voltage increases, the delay in generating said output signal increases therewith, said clocking circuit comprising:

a capacitive load for storing an amount of charge;

charge means for linearly charging said capacitive load from ground potential GND;

switch means coupled between said capacitive load and said charge means for controlling linear charging of said capacitive load by said charge means, said switch means being responsive to said input signal; and detection means coupled to said capacitive load for detecting linear charging of the capacitive load to a trigger level $V_0$ and for providing said output signal upon detection of said trigger level $V_0$ at said capacitive load, said trigger level $V_0$ being predefined relative to said supply voltage VDD to track variation in said supply voltage VDD, wherein linearly charging said capacitive load from the ground potential GND, and detecting linear charging of the capacitive load to the trigger voltage $V_0$ that is predefined relative to the supply voltage VDD to track variation in the supply voltage VDD results in the delay in providing the output signal relative to the input signal that varies with variation in the supply voltage VDD such that as the supply voltage VDD increases, the delay in providing the output signal increases therewith.

21. The clocking circuit of claim 20, further comprising discharge means for discharging said capacitive load to said ground potential GND, and wherein said switch means is coupled between said capacitive load and said discharge means.

22. The clocking circuit of claim 20, wherein said charge means comprises a current source, said current source producing a constant current that is substantially independent of variation in said supply voltage VDD.

23. The clocking circuit of claim 20, wherein said trigger level $V_0$ is proximate to the supply voltage VDD in a range from the ground potential GND to the supply voltage VDD.

24. The clocking circuit of claim 23, wherein said trigger level $V_0$ is approximately one transistor threshold voltage $V_T$ below the supply voltage VDD.

25. The clocking circuit of claim 20, wherein said detection means comprises a first inverter, said first inverter being coupled between said supply voltage VDD and the ground potential GND, and being coupled to the capacitive load for monitoring of stored charge at said capacitive load.

26. The clocking circuit of claim 25, wherein said first inverter comprises an n-type field-effect transistor (NFET) and a p-type field-effect transistor (PFET), said NFET and said PFET being commonly gated by said capacitive load and having commonly coupled drains.

27. The clocking circuit of claim 26, wherein said NFET is smaller than said PFET and said NFET and said PFET have a size ratio NFET:PFET of at least 1:10, and wherein said trigger level $V_0$ is determined principally by said size ratio NFET:PFET of said first inverter.

28. The clocking circuit of claim 25, wherein said switch means comprises a second inverter, said second inverter being coupled between said charge means and the ground potential GND, and having an output connected to said capacitive load.

29. The clocking circuit of claim 20, wherein said clocking circuit is employed within a memory device powered by said supply voltage VDD, said memory device having a sense amplifier, said clocking circuit being coupled to control setting of said sense amplifier.

30. A clocking circuit for a memory device powered by a supply voltage VDD, said memory device having at least one sense amplifier, said clocking circuit producing in response to an input signal a set signal for sense amplifier setting, said clocking circuit having a delay in generating said output signal relative to said input signal that varies with variation in said supply voltage VDD such that as said supply voltage VDD increases, the delay in generating said set signal increases therewith, said clocking circuit comprising:

a current source for producing a constant current independent of variation in said supply voltage VDD;

a capacitive load for storing charge;

switch means coupled between said capacitive load and said current source for controlling linear charging of said capacitive load by said current source, said switch means being responsive to said input signal; and detection means coupled to said capacitive load for detecting linear charging of the capacitive load to a trigger level $V_0$ and for providing said set signal upon detection of said trigger level $V_0$ at said capacitive load, said trigger level $V_0$ being predefined relative to said supply voltage VDD to track variation in said supply voltage VDD, wherein linearly charging said capacitive load and detecting linear charging of the capacitive load to the trigger voltage $V_0$ that is predefined relative to the supply voltage VDD to track variation in the supply voltage VDD results in the delay in providing the output signal relative to the input signal that varies with variation in the supply voltage VDD such that as the supply voltage VDD increases, the delay in producing the output signal increases therewith.

31. The clocking circuit of claim 30, wherein said trigger level $V_0$ is proximate to the supply voltage VDD in a range from ground potential GND to the supply voltage VDD.

32. The clocking circuit of claim 31, wherein said trigger level $V_0$ is approximately a transistor threshold voltage $V_T$ below the supply voltage VDD.

33. The clocking circuit of claim 30, wherein said detection means comprises a first inverter, said first inverter being coupled between said supply voltage VDD and ground potential GND, and connected to receive as input charge stored at said capacitive load.

34. The clocking circuit of claim 33, wherein said first inverter includes an n-type field-effect transistor (NFET) and a p-type field-effect transistor (PFET), said NFET and said PFET being commonly gated by said capacitive load and having commonly coupled drains.

35. The clocking circuit of claim 34, wherein said NFET is smaller than said PFET, and said NFET and said PFET having a size ratio NFET:PFET of at least 1:10.

36. The clocking circuit of claim 30, wherein said memory device comprises a dynamic random access memory device and wherein said clocking circuit is coupled between a word line driver and a sense amplifier of the dynamic random access memory device.

37. A clocking method for generating an output signal in response to an input signal, said clocking method incorporating a delay in said output signal relative to said input signal that varies with variation in a supply voltage VDD such that as said supply voltage increases, the delay in generating said output signal increases therewith, said clocking method comprising the steps of:

(a) storing a first amount of charge at a capacitive load, said first amount of charge stored varying with said supply voltage VDD;

(b) responsive to said input signal, linearly discharging said first amount of charge stored at the capacitive load;

(c) simultaneous with said step (b), detecting when a trigger level $V_0$ exists at said capacitive load, said trigger level $V_0$ being predefined, fixed relative to ground potential GND and independent of said supply voltage VDD, said first amount of charge being greater than said trigger level $V_0$; and (d) outputting said output signal upon detecting in said step (c) said trigger level $V_O$, wherein said first amount of charge stored at said capacitive load varying with said supply voltage VDD, said linearly discharging of said first amount of charge stored at said capacitive load and said detecting said trigger level $V_0$ that is independent of said supply voltage VDD results in the delay in outputting said output signal relative to said input signal that varies with variation in said supply voltage VDD such that as said supply voltage VDD increases, the delay in outputting said output signal increases therewith.

38. The clocking method of claim 37, further comprising the step of switching between said steps (a) and (b) in response to changes in said input signal.

39. The clocking method of claim 38, wherein said trigger level $V_0$ of said detecting step (c) is proximate to the ground potential GND in a range from the ground potential GND to the supply voltage VDD.

40. The clocking method of claim 39, wherein said trigger level $V_0$ of said detecting step (c) is approximately a transistor threshold voltage $V_T$ above the ground potential GND.

41. The clocking method of claim 37, further comprising the step of employing said steps (a)–(d) in a memory device to control sense amplifier setting within the memory device.

42. A clocking method for generating an output signal in response to an input signal, said clocking method incorporating a delay in said output signal relative to said input signal that varies with variation in a supply voltage VDD such that as said supply voltage increases, the delay in generating said output signal increases therewith, said clocking method comprising the steps of:

(a) providing a capacitive load for storing an amount of charge;

(b) linearly charging the capacitive load from ground potential GND;

(c) simultaneous with said step (b), detecting when a trigger level $V_0$ exists at the capacitive load, said trigger level $V_0$ being predefined relative to said supply voltage VDD to track variation in said supply voltage VDD; and (d) outputting said output signal upon detecting in said step (c) said trigger level $V_O$, wherein linearly charging said capacitive load from the ground potential GND, and detecting said trigger voltage $V_0$ that is predefined relative to the supply voltage VDD to track variation in the supply voltage VDD results in the delay in outputting the output signal relative to the input signal that varies with variation in the supply voltage VDD such that as the supply voltage VDD increases, the delay in generating the output signal increases therewith.

43. The clocking method of claim 42, wherein said trigger level $V_0$ of said detecting step (c) is proximate to the supply voltage VDD in a range from the ground potential GND to the supply voltage VDD.

44. The clocking method of claim 43, wherein said trigger level $V_0$ of said detecting step (c) is approximately a transistor threshold voltage $V_T$ below the supply voltage VDD.

45. The clocking method of claim 42, further comprising the step of employing said steps (a)–(d) in a memory device to control sense amplifier setting within the memory device.

* * * * *

UNITED STATES PATENT AND TRADEMARK OFFICE
CERTIFICATE OF CORRECTION

PATENT NO. : 5,532,969
DATED : Jul. 2, 1996
INVENTOR(S) : Houghton et al.

It is certified that error appears in the above-indentified patent and that said Letters Patent is hereby corrected as shown below:

Title page, item [54] after the word "VDD" insert --INCREASES--.

Column 1, line 2, after the word "VDD" insert --INCREASES--.
Column 4, line 1, delete "$VDD_H$" and substitute therefor --$VDD_L$--.
Column 6, line 21, between "6" and "This" insert --.--.

Signed and Sealed this

Twenty-sixth Day of November 1996

Attest:

BRUCE LEHMAN

Attesting Officer  Commissioner of Patents and Trademarks